United States Patent [19]

Mehrgardt et al.

[11] Patent Number: 4,841,463
[45] Date of Patent: Jun. 20, 1989

[54] NONRECURSIVE DIGITAL FILTER

[75] Inventors: Soenke Mehrgardt, March; Bernhard Ehret, Freiburg, both of Fed. Rep. of Germany

[73] Assignee: Deutsche ITT Industries GmbH, Freiburg, Fed. Rep. of Germany

[21] Appl. No.: 75,024

[22] Filed: Jul. 15, 1987

[30] Foreign Application Priority Data

Aug. 7, 1986 [EP] European Pat. Off. ........ 86110932.0

[51] Int. Cl.$^4$ ............................................. G06F 15/31
[52] U.S. Cl. ................................................ 364/724.16
[58] Field of Search ............... 364/724, 728, 724.16, 364/728.06, 750.5; 379/411; 333/165–167

[56] References Cited

U.S. PATENT DOCUMENTS

| | | | |
|---|---|---|---|
| 3,824,384 | 7/1974 | Murata et al. | 364/724 |
| 3,892,953 | 7/1975 | Nussbaumer | 364/724 |
| 4,571,719 | 2/1976 | Cadquist et al. | 379/411 |
| 4,701,874 | 10/1987 | Akai et al. | 364/724 |
| 3,949,206 | 4/1976 | Edwards et al. | 364/724 |

FOREIGN PATENT DOCUMENTS 0105998 4/1984 European Pat. Off. .

OTHER PUBLICATIONS

Patent Abstracts of Japan, vol. 9, No. 131 (E-319)-(1854) Jun. 6, 1985, Nippon Denshin Denwa Kosha. Internation Journal of Electronis, vol. 55, No. 4, Oct. 1983, pp. 675–679; On the Use of Look-Up Tables in the Microprocessor Implementation of Digital Filters-A. N. Skodras.

Primary Examiner—Gary V. Harkcom
Assistant Examiner—Dale M. Shaw
Attorney, Agent, or Firm—Thomas L. Peterson

[57] ABSTRACT

The signal path of a nonrecursive digital filter contains a series combination of like delay elements each providing a delay equal to the period of a clock signal or to a multiple thereof, each of the delay elements having a subtracter and a read-only memory associated therewith. The minuend inputs of each of the subtracters associated with the first half of delay elements is connected to the input of the associated delay element, and that of each of the substracters associated with the second half of delay elements to the output of the associated delay element, while the subtrahend inputs of all subtracters are connected to the center tap of the series combination of delay elements and to the first input of an adder. The output of each of the subtracters is coupled to the address input of the associated read-only memory, which has its output connected to one of the inputs of a multiple-input adder. The output of the latter is fed to the second input of the adder. Each read-only memory contains the function $e=bd$, where $d$ is the output signal of the subtracter, and $b$ is a value dependent on the difference between the center-tap signal value and the input-signal value of the respective delay element of the first half of delay elements or the output-signal value of the respective delay element of the second half. This digital filter shows adaptive behavior.

5 Claims, 6 Drawing Sheets

FIG. 6

|     | T1 | T2 | T3 | T4 | T5 | T6 | T7 | T8 | T9 | T10 | T11 | T12 |
|-----|----|----|----|----|----|----|----|----|----|----|----|----|
| eg  | i1 | i2 | i3 | i4 | i5 | i6 | i7 | i8 | i9 | i10 | i11 | i12 |
| m1  |    | i1 | i2 | i3 | i4 | i5 | i6 | i7 | i8 | i9 | i10 | i11 |
| m2  |    |    | i1 | i2 | i3 | i4 | i5 | i6 | i7 | i8 | i9 | i10 |
| m3  |    |    |    | i1 | i2 | i3 | i4 | i5 | i6 | i7 | i8 | i9  |
| m4  |    |    |    |    | i1 | i2 | i3 | i4 | i5 | i6 | i7 | i8  |

|    | t13 | t14 | t15 | t16 | t17 | t18 | t19 | t20 | t21 | t22 | t23 | t24 |
|----|-----|-----|-----|-----|-----|-----|-----|-----|-----|-----|-----|-----|
|    |     |  T8 |     |     |     |  T9 |     |     |     | T10 |     |     |
| m1 | ↓   |     |     | ↑   | ↓   |     |     | ↑   | ↓   |     |     | ↑   |
| m2 | ↓   |     |     | ↑   | ↓   |     |     | ↑   | ↓   |     |     | ↑   |
| m3 | ↓   |     |     | ↑   | ↓   |     |     | ↑   | ↓   |     |     | ↑   |
| m4 | ↓   |     |     | ↑   | ↓   |     |     | ↑   | ↓   |     |     | ↑   |
| a  | i4  |     |     | i7  |     |     | i7  |     |     |     |     |     |
| b  |     | i5  | i6  |     |     | i6  |     | i8  |     |     |     |     |
| c  |     |     |     |     | i5  |     |     |     | i6  | i7  | i8  | i9  |
| d  |     |     |     |     |     |     |     |     |     |     |     |     |
| e  | i4-i8 ≙ e13 | i5-i8 ≙ e14 | i6-i8 ≙ e15 | i7-i8 ≙ e16 | i5-i9 ≙ e17 | i6-i9 ≙ e18 | i7-i9 ≙ e19 | i8-i9 ≙ e20 | i6-i10 ≙ e21 | i7-i10 ≙ e22 | i8-i10 ≙ e23 | i9-i10 ≙ e24 |
| aa |     | 13s14 | 13s15 | 13s16-e16 | k3-e17 | 17s18 | 17s19 | 17s20 | k4+i5 | 21s22 | k13-e23 | 17s20-e24 |
| sa |     | k2-e14 | k5-e15 | 9s12-e6 | =k4 | k6-e18 | k9-e19 | 13s16-e20 | k7-e21 | k10-e22 | =k14 | =k17 |
|    |     | =k3 | =k6 | =k9 |     | =k7 | =k10 | =k13 | =k8 | =k11 |     |     |
| ag |     |     |     |     |     |     |     |     | (k4)/8+ i15 |     |     |     |

FIG. 8b

NONRECURSIVE DIGITAL FILTER

BACKGROUND OF THE INVENTION

The present invention relates to a nonrecursive digital filter comprising a series combination of a number of like delay elements in the signal path each providing a delay equal to the period of the clock signal of the digital filter or to a multiple thereof, and an adder whose output is the filter output.

The principle of a digital filter of this kind is described in the published Patent Application No. EP-A 105 998. There, however, only one arbitrary tap of the delay elements and the taps located symmetrically with respect to the center tap as well as the output of a constant multiplier are connected to the inputs of the adder, with the input of the constant multiplier connected to the center tap of the series combination. This prior art arrangement serves as a digital filter for the digital luminance channel of a color-television set.

SUMMARY OF THE INVENTION

By contrast, the object of the invention as claimed is to provide a nonrecursive digital filter suitable for suppressing noise in digital signals, particularly in video signals.

BRIEF DESCRIPTION OF THE DRAWINGS

The invention will now be explained in more detail with reference to the accompanying drawings, in which:

FIG. 6 shows the time assignment of individual input signals of FIG. 4 in the form of a table;

FIG. 7 shows definitions for partial-result signals of FIG. 4 in the form of a second table; and FIGS. 8, 8a and 8b show the time assignment of signals of the first table and the second table, of further partial results, and of a final result in the form of a third table.

DETAILED DESCRIPTION OF SEVERAL PREFERRED EMBODIMENTS

Figure 1:
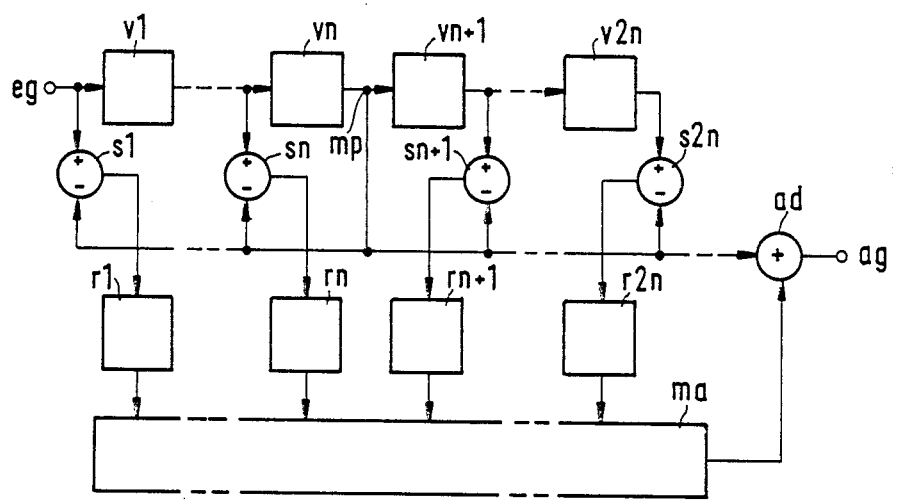
FIG. 1 is a digital filter block diagram illustrating the principle underlying the invention.

FIG. 1 shows an embodiment of the digital filter of the invention in a block diagram, i.e., in the representation commonly used to illustrate digital filter circuits. The signal path contains the even number $2n$ of like delay elements $v1$, $vn$, $vn+1$, $v2n$. The input eg of the digital filter is thus connected to the input of the first delay element $v1$. The delay provided by each of these delay elements is equal to the period of the clock signal ts of the digital filter or to a multiple thereof (see FIG. 5a).

Associated with each delay element are a subtracter and a read-only memory. The minuend inputs of the subtracters associated with the first half of delay elements $v1$, $vn$ are connected to the inputs of the associated delay elements, and those of the subtracters associated with the second half of delay elements $vn+1$, $v2n$ are connected to the outputs of the associated delay elements. Thus, the subtracter s1 and the read-only memory r1 are associated with the delay element $v1$, the subtracter sn and the read-only memory rn with the delay element $vn$, the subtracter $sn+1$ and the read-only memory $rn+1$ with the delay element $vn+1$, and the subtracter $s2n$ and the read-only memory $r2n$ with the delay element $v2n$. The subtrahend inputs of all subtracters $s1 \ldots s2n$ are connected to the center tap mp of the series combination of delay elements and to the first input of the adder ad, whose output is the filter output ag. The outputs of the subtracters are coupled to the address inputs of the associated read-only memories.

Each read-only memory contains the function $e = bd$, where d denotes the output signal of the associated subtracter, and b denotes a value that depends on the difference between the signal value at the center tap mp and the input-signal value of the respective delay element of the first half of delay elements or the output-signal value of the respective delay element of the second half of delay elements. The output of each of the read-only memories is connected to one of the inputs of the multiple-input adder ma, whose output is coupled to the second input of the adder ad.

In the digital filter according to the invention, the digital words arriving at the input eg pass through the series-connected delay elements, so that for the digital word appearing at the center tap mp at any particular instant, the digital words preceding that word by n periods of the clock signal and the digital words following that word after n periods of the clock signal are available at the same time. The subtracters therefore form the difference between these individual digital words and the center-tap digital word. Depending on this difference, the associated function value $e = bd$ appears at the output of the respective read-only memory. These function values are then summed by the multiple-input adder ma, and the sum is added to the center-tap digital word. The digital filter thus shows a certain form of adaptive behavior.

Figure 3:
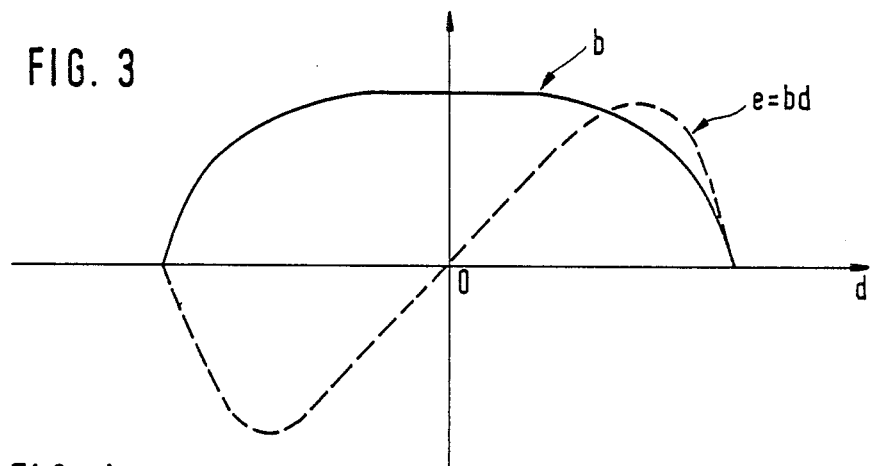
FIG. 3 shows schematically a possible dependence of the function stored in the read-only memories.

FIG. 3 shows possible qualitative dependencies of the values b and $e = bd$ on the value d.

Figure 2:
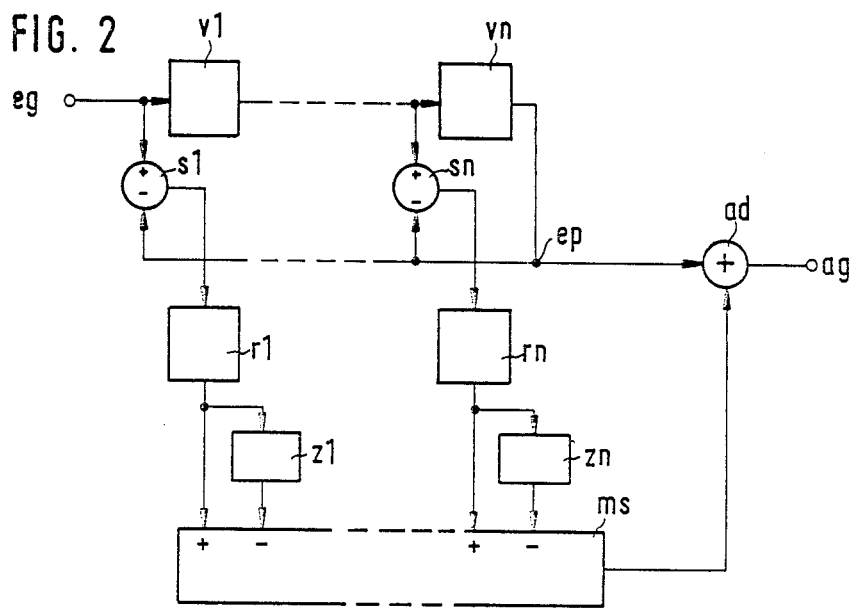
FIG. 2 shows a simplified form of the arrangement of FIG. 1 for a specific application.

FIG. 2, a block diagram like FIG. 1, shows a modification of the digital filter of FIG. 1 for the case where the first half of read-only memories r1, rn is arranged symmetrically with respect to the second half $rn+1$, $r2n$, so that the content of an mth read-only memory of the first half on an address is equal to the negative content of the $(2n+1-m)$th read-only memory of the second half on the address -adr, where m is less than or equal to n. With ten delay elements, for example, the first and tenth $(m=1)$, the second and ninth $(m=2)$ delay elements, etc., are symmetrical with respect to each other. For such cases, the second half of the delay elements, i.e., $vn+1$, $v2n$, the second half of the subtracters, $sn+1$, $s2n$, and the second half of the read-only memories, $rn+1$, $r2n$, can be dispensed with, so that in the arrangement of FIG. 2, the tap corresponding to the center tap mp of FIG. 1 becomes the end tap ep of the series combination of delay elements.

Associated with each of the remaining read-only memories r1, rn is the additional delay element z1, zn whose input is connected to the output of the respective read-only memory r1, rn. The delay provided by the additional delay element at the signal-input end, r1, is n times the period of the clock signal, and that provided by the following additional delay element is n−1 times the period, etc., where n is the remaining number of delay elements v1, vn. The delay produced by the last additional delay element zn is thus equal to the period of the clock signal ts.

In the modification of FIG. 2, the multiple-input adder ma of FIG. 1 is designed as a multiple-input adder/subtracter ms as the addend inputs assigned to the eliminated read-only memories rn+1, r2n of FIG. 1 have been changed into subtrahend inputs, as is indicated by corresponding minus signs.

Figure 4:
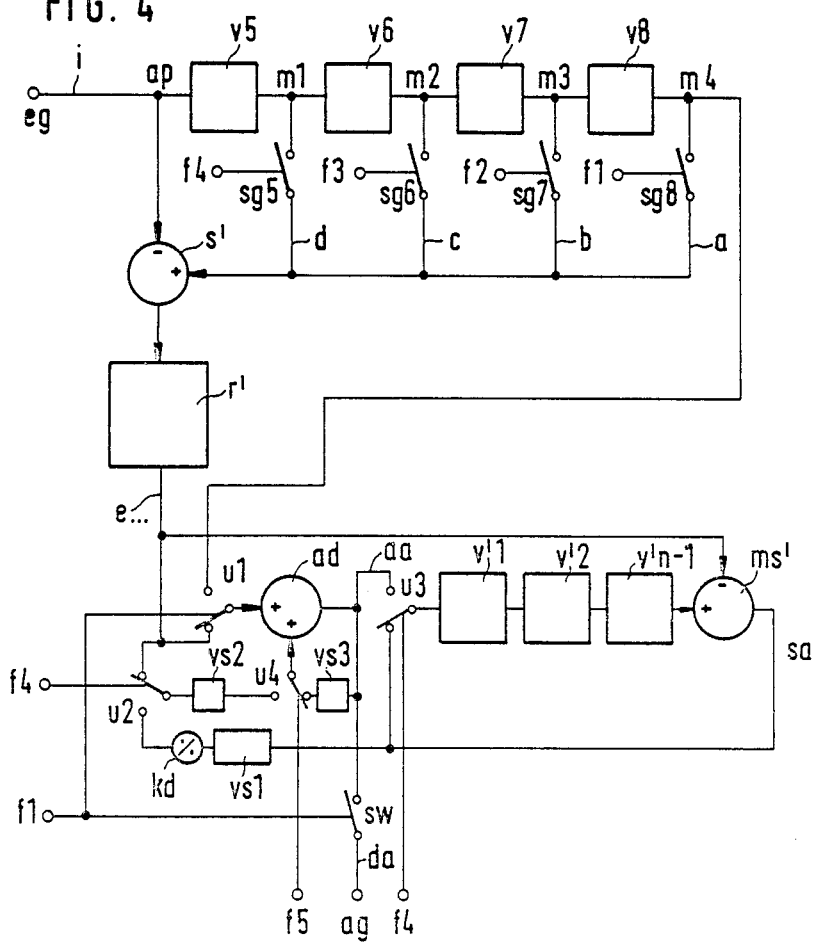
FIG. 4 shows a specific embodiment of the invention in which individual filter subnetworks are operated in a multiplex mode.

FIG. 4 shows an embodiment of the invention for the case where the read-only memories are arranged symmetrically as mentioned above, and where the data rate of the digital signals to be filtered is equal to one nth of the frequency of the clock signal ts, "data rate" being understood to mean the frequency of the clock signal at which the digital signals are applied to the input eg of the digital filter. In the concrete case of FIG. 4, n=4.

In FIG. 4, unlike in the arrangement of FIG. 2, the first half of the delay elements, i.e., v1, vn, the first half of the subtracters, s1, sn, and the first half of the read-only memories, r1, rn, have been eliminated, so that the tap corresponding to the center tap mp of FIG. 1 is the initial tap ap. The remaining delay elements v5, v6, v7, v8 are elements of the second half, and their delay is equal to n times, i.e., four times, the period of the clock signal ts; a corresponding auxiliary clock signal is shown in FIG. 5b.

Of the n subtracters and read-only memories, only the subtracter s' and the read-only memory r' are present, and the multiple-input adder/subtracter ms has been replaced by the additional subtracter ms'. These subcircuits are used n, i.e., four, times in succession within the period corresponding to the data rate, the adder ad cooperating with the subtracter ms' during n−1, i.e., three, periods of the clock signal to perform the function of the multiple-input adder/subtracter.

The outputs of the delay elements v5 . . . v8 are fed to the minuend input of the subtracter s' via associated switching devices sg5, sg6, sg7, and sg8, whose control inputs are fed with the nth, i.e., fourth, auxiliary clock signal f4, the (n−1)st, i.e., third, auxiliary clock signal f3, the second auxiliary clock signal f2, and the first auxiliary clock signal f1, respectively. The frequency of these auxiliary clock signals is equal to one nth, i.e., one fourth, of the frequency of the clock signal ts, and the pulse width of these signals is equal to the period of the clock signal, with the effective pulses of the individual auxiliary clock signals being shifted with respect to each other by this period and following each other with increasing index number, see FIGS. 5d to 5g. During the H level of the effective pulses of the auxiliary clock signals f1 . . . f4, the respective switching device sg5 . . . sg8 is in the conducting state.

The output of the read-only memory r' is coupled not only to the subtrahend input of the subtracter ms' but also to the first inputs of the first and second switches u1, u2. The output of the last delay element v8 is connected to the second input of the first switch u1, whose output is coupled to the first input of the adder ad.

The output of the adder ad is applied to the first input of the third switch u3, which has its output connected to the input of the series combination of n−1, i.e., three, additional delay elements v'1, v'2, v'n−1, and through the additional switching device sw to the output ag of the digital filter. The control input of the switching device sw is supplied with the first auxiliary clock signal f1.

The output of the last additional delay element v'n−1 is coupled to the minuend input of the subtracter ms', which has its output connected to the second input of the third switch u3. This second input is also connected via the first delay stage vs1 and the constant divider kd to the second input of the second switch us2, whose output is coupled through the second delay stage vs2 to the first input of the fourth switch u4. The second input and the output of the latter are connected, respectively, to the output of the adder ad via the third delay stage vs3 and to the second input of the adder ad.

The delay provided by the first delay stage vs1 is equal to n−1 times, i.e., three times, the period of the clock signal ts. The delays of the second and third delay stages vs2, vs3 and the n−1 additional delay stages v'1 . . . v'n−1 are each equal to the period of the clock signal ts. The constant divider kd reduces the number of bits in the digital words appearing at the output of the first delay stage vs1 to the number of bits predetermined at the input of the second delay stage vs2 by the output of the read-only memory r'. In a practical circuit, the division constant fed to the constant divider kd was a digital word corresponding to the decimal number 8.

The control input of the first switch u1 is supplied with the first auxiliary clock signal f1, and the control inputs of the second and third switches u2, u3 are supplied with the nth, i.e., fourth, auxiliary clock signal f4. The control input of the fourth switch u4 is fed with the additional auxiliary clock signal f5, which has a 1:1 mark/space ratio and a frequency equal to one nth, i.e., one fourth, of the frequency of the clock signal ts.

The positions of the switches u1 . . . u4 shown in FIG. 4 are those in which the switches are when the auxiliary clock signals f1, f4, f5 are at the L level. When the auxiliary clock signals f1, f4, f5 are at the H level, the outputs of the first, third, and fourth switches u1, u3, u4 are connected to the first input of the respective switch, that of the second switch to the second input of this switch, and that of the additional switching device sw to the input of this device.

In the arrangement of FIG. 4, multiplex operation is achieved by the clocking with the five auxiliary clock signals f1 . . . f5. Thanks to the resulting multiple utilization of individual subcircuits, the amount of chip area required to implement the digital filter as an integrated circuit is considerably smaller than without the use of multiplexing.

Figure 5:
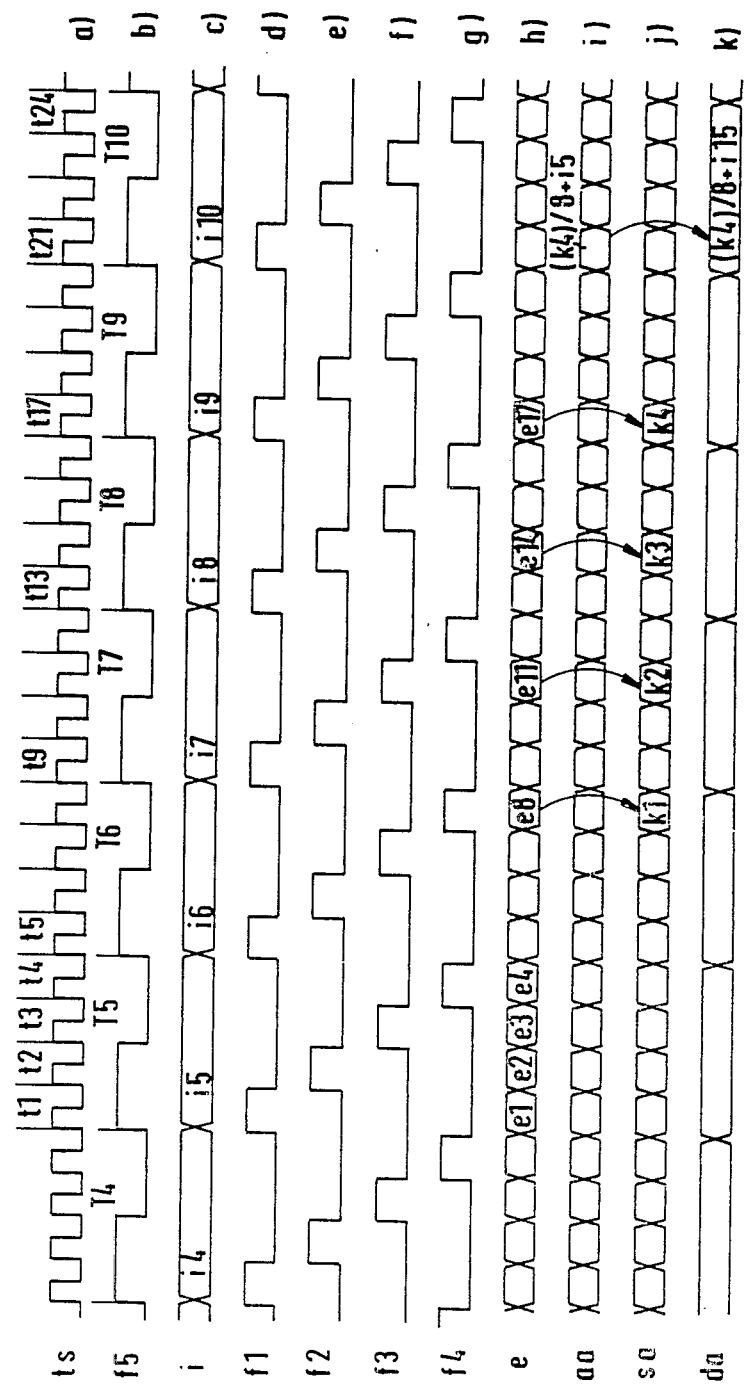
FIG. 5 shows waveforms of various signals needed and occurring in the arrangement of FIG. 4.

FIG. 5 shows schematically the waveforms of the clock signals used in the embodiment of FIG. 4 and the temporal positions of individual calculation results in relation to concrete periods of the auxiliary clock signals. To understand FIG. 5, it is necessary to refer to the tables of FIGS. 6 to 8. These tables form part of the description.

They show the time assignment and the order of the individual calculation steps. In the following exemplary explanation of the operation of the circuit for a single final result, FIGS. 5 to 8 will, therefore, be considered together. It will be assumed that the computation times of the adders and subtracters and the time required to read information from the read-only memory are short compared with the period of the clock signal, i.e., negligible.

Figures 6, 7:
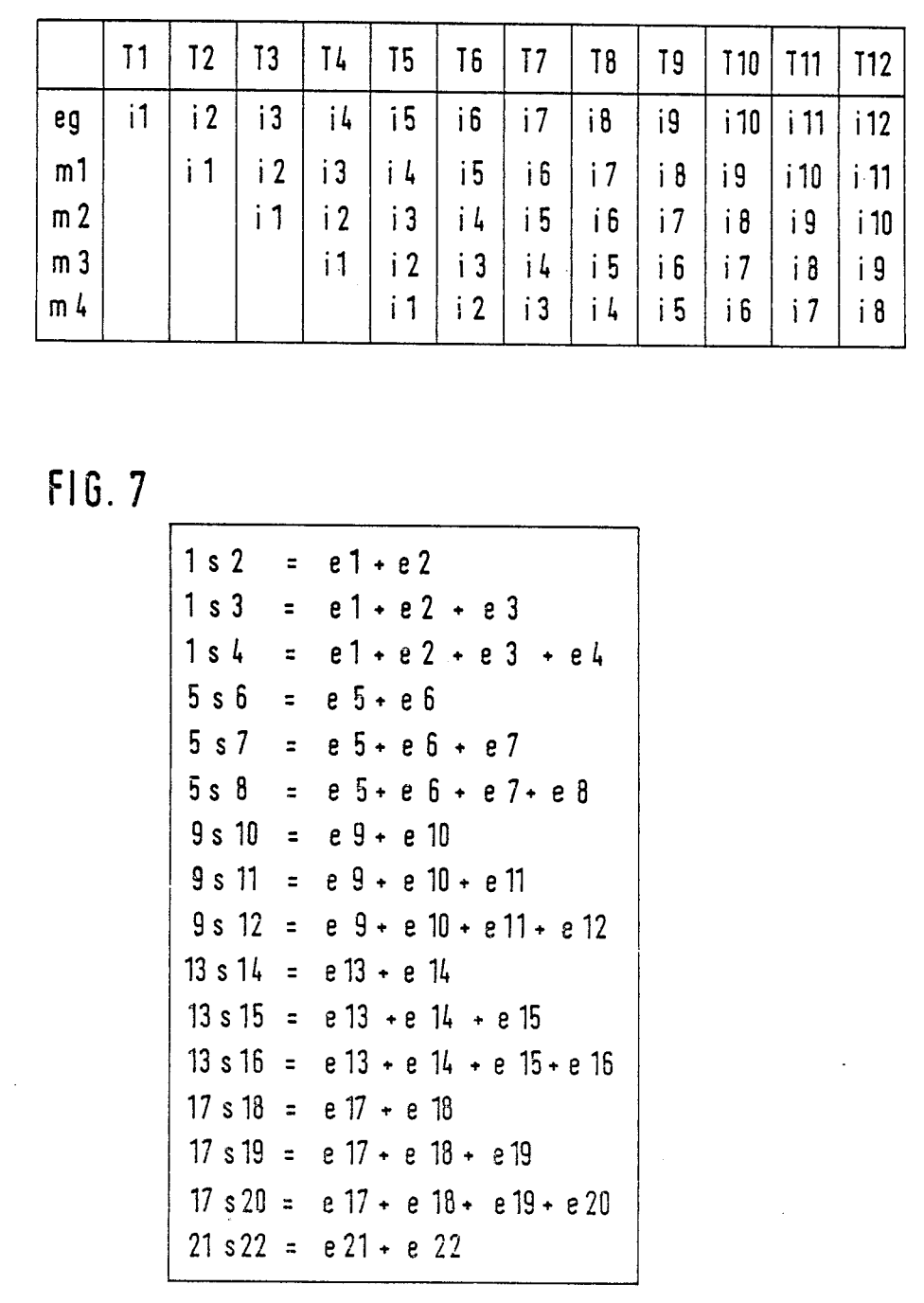

In FIGS. 5a and 5b, successive "short" periods, designated t, and "long" periods, designated T and numbered consecutively, are defined for the clock signal ts and the auxiliary clock signal f5, respectively. For simplicity it is assumed that the digital filter begins to operate at the period T1 of the auxiliary clock signal f5, and that during the twelve periods T1 ... T12, the twelve digital words i1 ... i12 appear successively at the input eg, as shown in the table of FIG. 6. At the outputs m1 ... m4 of the four delay elements v5 ... v8, the digital words i1 ... i12 then appear after successive periods of the auxiliary clock signal f5. This gives a matrix of digital words as shown in the table of FIG. 6, where the row of digital words i1 ... i12 shifts one column to the right as the number of rows increases by one.

Of the long periods T1 ... T12, the periods T4 ... T10 are shown in FIG. 5. The final result being considered is calculated during the periods T5 ... T9, and at the beginning of the period T10, the final result reaches the output ag, see FIG. 5k.

Beginning with the period T5, the short clock-signal periods during these six periods are consecutively designated by t1 ... t24, see FIGS. 5a and 8.

Figure 8A:
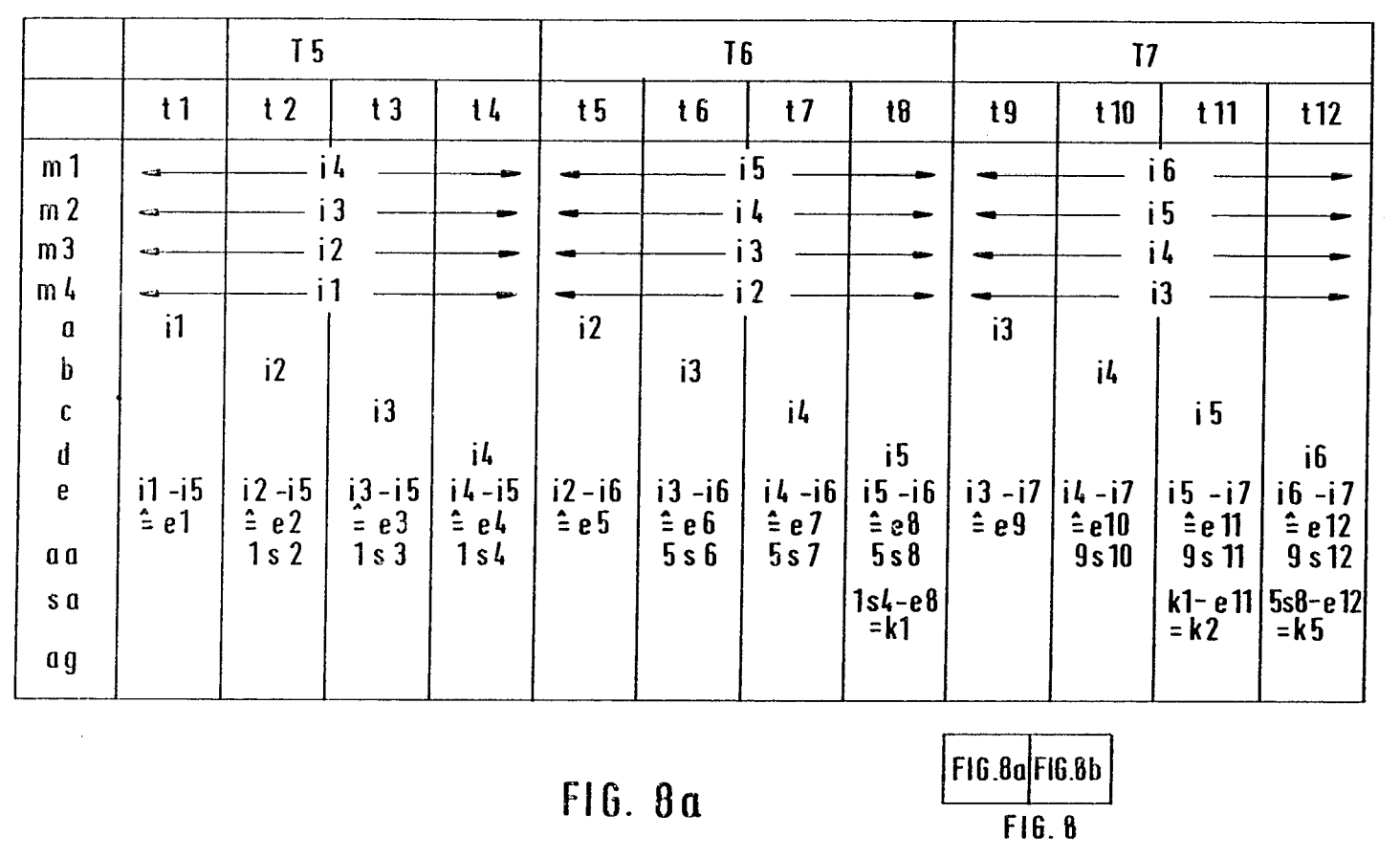

As shown in FIG. 8a, the digital word i4 is present at the output of the delay element v5 during the period T5, i.e., also during the four periods t1 ... t4. This digital word i4 appears at the output m2 during the period T6, at m3 during T7, and at m4 during T8. With this, the description of the transfer of the digital word i4 through the series combination of the delay elements v5 ... v8 is completed. On the other hand, the output m1 of the delay element v5 provides the digital word i4 during the period T5, the digital word i5 during T6, the digital word i6 during T7, the digital word i7 during T8, the digital word i8 during T9, and the digital word i9 during T10. The same applies analogously to the outputs m2 ... m4, which provide the digital words i3 ... i8, i2 ... i7, and i1 ... i6, respectively, during the periods T5 ... T10.

Since the digital word i5 is present at the input eg and, thus, at the subtrahend input of the subtracter s' during the long period T5, the differences between the digital words i1 ... i4 and i5, which produce the output signals e ..., designated e1 ... e4 in FIG. 8a, at the output of the read-only memory r', are determined during the four short periods t1 ... t4. In similar fashion, the output signals e5 ... e24, corresponding to the respective differences, as shown in FIGS. 8a and b, row e, are produced by the read-only memory r' during the long periods T6 ... T10. In FIG. 5a, some of the digital words e1 ... e24 are designated by the respective reference characters.

During every second, third, and fourth period of the clock signal ts within a period of the auxiliary clock signal f5, i.e., during the periods t2 ... t4, t6 ... t8, for example, the adder ad acts as an accumulator for the respective four differences e1 ... e4, e5 ... e8, etc. For the result of the respective accumulation, the reference characters in the rows aa of FIGS. 8a and 8b were chosen; their definitions are shown in the table of FIG. 7. The systematics of these reference characters consist in the fact that the letter s is preceded by that consecutive number of the differences e ... which occurs during the first short period within a long period, i.e., during t1, t5, t9, etc., and that the letter s is followed by the consecutive number of the last differences accumulated within a long period.

Since during the short periods t2 ... t4 the first and third switches u1, u3 are in the positions shown in FIG. 4, while during the periods t1, t2 the switch u4 is in the position not shown, and during the periods t1 ... t3 the switch u2 is in the position shown, the digital word e1 is transferred to the input of the delay stage vs2 during the period t1, and to the output of this stage at the beginning of the period t2, so that it appears at one of the inputs of the adder ad, whose other input is supplied with the digital word e2 at the beginning of the period t2. The output of the adder ad thus provides the digital word $e1+e2=1s2$, which, after being delayed by the delay stage vs2, is applied to one of the adder inputs at the beginning of period t3, at which time the digital word e3 appears at the other input. The output thus provides the digital word 1s3, which is applied to one of the adder inputs at the beginning of the period t4, at which time the digital word e4 appears at the other input. The output of the adder then delivers the digital word 1s4 during the period t4.

Since during the period t4 the switch u3 is in the position not shown, this word is fed to the input of the delay stage v1', and after three periods, i.e., at the beginning of the period t8, to the minuend input of the subtracter ms', at which time the digital word e8 appears at the subtrahend input of this subtracter. The output of the latter thus provides the difference $1s4-e8=k1$.

During the next three periods t9 ... t11, this digital word k1 is delayed in the three delay elements v'1 ... v'n−1, so that at the beginning of the period t11, it appears at the minuend input of the subtracter ms', whose subtrahend input is simultaneously supplied with the digital word e11 from the read-only memory r', since during the period t9 the third switch u3 is in the position shown. During the period t11, the output of the subtracter ms' provides the digital word $k2=k1-e11$, which is transferred to the input of the three delay elements v'1 ... v'n−1, because during the period t11, the switch u3 is in the position shown. During the period t14, the digital word k2 is thus present at the minuend input of the subtracter ms', and at the same time digital word e14 is present at the subtrahend input of this subtracter. The output of the subtracter ms' thus provides the digital word $k3=k2-e14$.

This word, too, is passed through the three delay elements v'1 ... v'n−1 and is present at the minuend input of the subtracter ms' during the period t17. At the same time, the subtrahend input of this subtracter is supplied with the digital word e17, so that the digital word $k4=k3-e17$ appears at the subtracter output.

This digital word k4 is delayed by three short periods in the first delay stage vs1 and divided by, e.g., 8 in the constant divider kd, so that it is presented as (k4)/8 to the second input of the switch u2 at the beginning of the period t20, during which this switch changes to the position not shown, because it is controlled by the auxiliary clock signal f4. During the next period t21, the digital word (k4)/8 is delayed by one short period in the delay stage vs2 so that it appears at one of the inputs of the adder ad at the beginning of the period t22. The other input of the adder is fed via the switch u1, which, too, is now in the position not shown, with the digital word e5, which is provided at the output m4 of the delay element v8 during the period t20.

During the period t21, the switching device sw is switched into the conducting state by the auxiliary clock signal f1, and the final result (k4)/8+i15 is transferred from the output of the adder ad to the output ag of the digital filter.

As shown in FIGS. 8a and 8b, during the second to the fourth short period within each of the long periods T5 ... T10, the subtractions are performed which result in the digital words e . . . and in the differences formed therefrom, . . . s . . . .

Simultaneously with these operations, the digital words k . . . are formed in the delay elements v'1 . . . v'n−1 and the subtracter ms', as explained earlier. During the first short period within each long period, the adder ad is used for forming a final result digital word. In rows aa of FIGS. 8a and 8b, which give the output signal of the adder ad, a result appears only in the period T10, because the explanation of the operation of the circuit starts from a zero state, as assumed hereinabove.

In the digital filter according to the invention, the signals are processed in parallel form, i.e., the individual bits of the digital words are processed simultaneously, use being made of pipelining if necessary.

The digital filter of the invention can be readily implemented with semiconductor integrated circuits, preferably with insulated-gate field-effect transistor circuits, i.e., MOS technology.

By suitable choice of the function e=bd, particularly of the dependence of b on d, adaptivity can be influenced. With the qualitative dependence of b on d shown in FIG. 3, low-pass characteristics are obtained.

The digital filter in accordance with the invention can be used to advantage in digital television-receiver circuits, particularly in circuits of the SECAM standard, but also in digital circuits of video recorders.

What is claimed is:

1. A nonrecursive digital filter comprising:
   a first group of delay elements and a second group of delay elements, all of said delay elements being connected in series and each of said delay elements providing a delay approximately equal to the period of a clock signal or a multiple of the period of said clock signal;
   a center tap connected between said first and said second groups of said delay elements;
   a first group of subtracters and a second group of said subtracters, each of said subtracters being associated with a respective one of said delay elements, the minuend input of each of said subtracters in said first group being connected to the input of a respective one of said delay elements in said first group, the minuend input of each of said subtracters in said second group being connected to the output of a respective one of said delay elements in said second group, and the subtrahend input of each of said subtracters being connected to said center tap;
   a plurality of read-only memories, the address input of each of said read-only memories being connected to the output of a respective one of said subtracters, each of said read-only memories containing the function e=bd, where d is the output signal of said respective one of said subtracters and b is a value responsive to the difference between the signal value at said center tap and the minuend input of said respective one of said subtracters;
   a first adder having a plurality of inputs each of which is connected to a respective one of the outputs of said read-only memories; and
   a second adder having a first input connected to said center tap and a second input connected to the output of said first adder.

2. A nonrecursive digital filter comprising:
   a plurality of first delay elements connected in series, each of said first delay elements providing a delay approximately equal to the period of a clock signal or a multiple of the period of said clock signal;
   a plurality of subtracters, the minuend input of each of said subtracters being connected to the input of a respective one of said first delay elements and the subtrahend input of each of said subtracters being connected to the output of one of said subtracters;
   a plurality of read-only memories, the address input of each of said read-only memories being connected to the output of a respective one of said subtracters;
   a plurality of second delay elements, the input of each of said second delay elements being connected to the output of a respective one of said read-only memories, each of said second delay elements providing a distinct delay from within a range of delays that varies in negative increments from a maximum delay of n times the period of said clock signal to a minimum delay equal to the period of said clock signal, each of said negative increments being approximately equal to the period of said clock signal and n being equal to the number of said first delay elements;
   an adder/subtracter having each of its minuend inputs connected to the output of a respective one of said read-only memories and each of its subtrahend inputs to a respective one of said second delay elements; and
   an adder having a first input connected to the subtrahend inputs of said subtractors and a second input connected to the output of said adder/subtracter.

3. A nonrecursive digital filter wherein the data rate of the digital signals filtered is approximately equal to one-nth of the frequency of a primary clock signal of the digital filter, said digital filter comprising:
   at least n first delay elements connected in series, the delay provided by each of said first delay elements being approximately equal to n times the period of said primary clock signal;
   a plurality of first switches, each of said first switches being connected to the output of a respective one of said first delay elements, each of said first switches being controlled by a respective one of n first auxiliary clock signals, each of said first auxiliary clock signals having a frequency approximately equal to one-nth the frequency of said primary clock signal and a positive pulse width approximately equal to the period of said primary clock signal;
   a subtracter having its subtrahend input connected to the input of one of said first delay elements and its minuend input connected to each of said first switches, the positive pulses of said first auxiliary clock signals sequentially activating said first switches one at a time whereby the outputs of said first delay elements are sequentially supplied one at a time to the minuend input of said subtracter;
   a read-only memory having an input connected to the output of said subtracter;
   a second switch connected to one of said delay elements and to the output of said read-only memory, the output of said second switch being controlled by a first of said n first auxiliary clock signals;
   an adder having a first input connected to the output of said second switch and a second input;
   a third switch connected to said second switch and to the output of said read-only memory, said third switch being controlled by the nth one of said first auxiliary clock signals;

a second delay element connected to the output of said third switch, said second delay element having a delay approximately equal to the period of said primary clock signal;

a fourth switch connected to the output of said adder, said fourth switch being controlled by said nth first auxiliary clock signal;

a fifth switch connected to the output of said second delay element, the output of said fifth switch being connected to said second input of said adder, said fifth switch being controlled by a second auxiliary clock signal having a frequency approximately equal to one-nth the frequency of said primary clock signal;

a third delay element connected between said fifth switch and said output of said adder, the delay provided by said third delay element being approximately equal to the period of said primary clock signal;

a sixth switch coupled to the output of said adder, said sixth switch being controlled by said first of said first auxiliary clock signals, said sixth switch providing the output of said digital filter;

a third delay element and a constant divider connected in series between said third switch and said fourth switch, the delay provided by said third delay element being approximately equal to $n-1$ times the period of said primary clock signal; and at least $n-1$ fourth delay elements connected in series between said fourth switch and the minuend input of a second subtracter, each of said fourth delay elements providing a delay approximately equal to the period of said primary clock signal, the subtrahend input of said second subtracter being connected to the output of said read-only memory, and the output of said subtracter being coupled to said fourth switch.

4. A digital filter as described in claim 3 wherein during the high levels of said first and nth of said first auxiliary clock signals and during the high level of said second auxiliary clock signal:

the output of said read-only memory is connected to said first input of said adder through said second switch;

the output of said adder is connected to the input of one of said fourth delay elements through said fourth switch;

said second delay element is connected to said third delay element through said fifth switch;

said second delay element is connected to said constant divider through said third switch; and said sixth switch is closed.

5. A digital filter as defined in claim 3 wherein $n=4$.

* * * * *